United States Patent
Miyazawa et al.

(10) Patent No.: US 9,418,884 B2
(45) Date of Patent: Aug. 16, 2016

(54) ELECTROSTATIC CHUCK AND SEMICONDUCTOR MANUFACTURING DEVICE

(71) Applicant: SHINKO ELECTRIC INDUSTRIES CO., LTD., Nagano-shi (JP)

(72) Inventors: Masakuni Miyazawa, Nagano (JP); Kazuyoshi Miyamoto, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 212 days.

(21) Appl. No.: 14/247,603

(22) Filed: Apr. 8, 2014

(65) Prior Publication Data

US 2014/0334059 A1  Nov. 13, 2014

(30) Foreign Application Priority Data

May 9, 2013 (JP) .................................. 2013-099269

(51) Int. Cl.
*H01L 21/683* (2006.01)
*H01L 21/687* (2006.01)

(52) U.S. Cl.
CPC ...... *H01L 21/68757* (2013.01); *H01L 21/6831* (2013.01)

(58) Field of Classification Search
CPC ..................... H01L 21/6831; H01L 21/68757
USPC .......................................................... 361/234
See application file for complete search history.

(56) References Cited

U.S. PATENT DOCUMENTS

| | | | |
|---|---|---|---|
| 7,091,146 B2* | 8/2006 | Okiyama | C04B 35/117 501/128 |
| 2004/0121192 A1* | 6/2004 | LaCourse | C04B 35/581 428/698 |
| 2006/0240972 A1* | 10/2006 | Lee | C04B 35/581 501/98.5 |
| 2013/0133828 A1* | 5/2013 | Yoshitaka | B29C 65/00 156/285 |

FOREIGN PATENT DOCUMENTS

| | | |
|---|---|---|
| JP | 2005-104746 A1 | 4/2005 |
| JP | 2009-212425 A1 | 9/2009 |

* cited by examiner

*Primary Examiner* — Scott Bauer
(74) *Attorney, Agent, or Firm* — Katz, Quintos & Hanson, LLP

(57) ABSTRACT

An electrostatic chuck includes a placing stage formed from a ceramic including aluminum oxide and yttrium oxide, and an electrostatic electrode arranged in the placing stage, wherein a content rate of the yttrium oxide is 0.5 wt % to 2.0 wt %. Preferably, the electrostatic chuck is used while being heated at a temperature of 100° C. to 200° C.

9 Claims, 5 Drawing Sheets

| sample | content rate (wt%) | | | | | | volume resistivity at 100°C (Ωcm) | volume resistivity at 150°C (Ωcm) | relative density (%) |
|---|---|---|---|---|---|---|---|---|---|
| | $Al_2O_3$ | $SiO_2$ | MgO | CaO | $Y_2O_3$ | total | | | |
| 1 | 96.1 | 2.6 | 1.1 | 0.2 | 0.0 | 100.00 | 2.49E+16 | 2.89E+15 | 95.50 |
| 2 | 95.9 | 2.6 | 1.1 | 0.2 | 0.3 | 100.00 | 2.85E+16 | 5.14E+15 | 95.67 |
| 3 | 95.6 | 2.6 | 1.0 | 0.2 | 0.5 | 100.00 | 4.95E+16 | 1.03E+16 | 95.88 |
| 4 | 95.2 | 2.6 | 1.0 | 0.2 | 1.0 | 100.00 | 5.00E+16 | 2.00E+16 | 95.98 |
| 5 | 94.7 | 2.6 | 1.0 | 0.2 | 1.5 | 100.00 | 6.17E+16 | 5.82E+16 | 96.04 |
| 6 | 94.2 | 2.6 | 1.0 | 0.2 | 2.0 | 100.00 | 3.74E+16 | 8.67E+16 | 96.23 |
| 7 | 93.8 | 2.5 | 1.0 | 0.2 | 2.5 | 100.00 | 2.32E+16 | 7.99E+15 | 96.35 |

ELECTROSTATIC CHUCK AND SEMICONDUCTOR MANUFACTURING DEVICE

CROSS-REFERENCE TO RELATED APPLICATIONS

This application is based upon and claims the benefit of priority of the prior Japanese Patent Application No. 2013-099269, filed on May 9, 2013, the entire contents of which are incorporated herein by reference.

FIELD

This invention is related to an electrostatic chuck to be used as a mechanism for attracting a wafer or the like, and to a semiconductor manufacturing device including the same.

BACKGROUND ART

In the prior art, in the semiconductor manufacturing devices such as the dry etching devices used in the semiconductor wafer process or the like, an electrostatic chuck on which a wafer is placed by electrostatic attraction so as to control the temperature of the wafer during its wafer process is usually provided.

Among such electrostatic chucks, there are high-temperature type ceramic chucks which are used while being heated by a heater.

A related art is disclosed in Japanese Laid-open Patent Publication No. 2005-104746 and Japanese Laid-open Patent Publication No. 2009-212425.

SUMMARY

As will be explained later in the section of preliminary matter below, in the high-temperature type ceramic electrostatic chuck, when the electrostatic chuck is heated, the volume resistivity of its ceramic decreases. Therefore, a wafer is attracted to the electrostatic chuck by stronger coulomb force than when the electrostatic chuck is used at room temperature.

For this reason, even if voltage applied to the electrostatic chuck is turned off, it is difficult to immediately detach the wafer. As a result, the throughput of the wafer processing is decreased.

According to one aspect discussed herein, there is provided an electrostatic chuck, including a placing stage formed from a ceramic including aluminum oxide and yttrium oxide, and an electrostatic electrode arranged in the placing stage, wherein a content rate of the yttrium oxide is 0.5 wt % to 2.0 wt %.

Also, according to another aspect discussed herein, there is provided a semiconductor manufacturing device, including a chamber, and an electrostatic chuck attached to the chamber, in which the electrostatic chuck includes a placing stage formed from a ceramic including aluminum oxide and yttrium oxide, and an electrostatic electrode arranged in the placing stage, and a content rate of the yttrium oxide is 0.5 wt % to 2.0 wt %.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment of the present invention will be explained with reference to the accompanying drawings.

Prior to the explanation of an embodiment, the preliminary matter to be set forth as a basis will be explained hereunder. Among electrostatic chucks, there are high-temperature type electrostatic chucks which are used while being heated by a heater.

Figure 1:
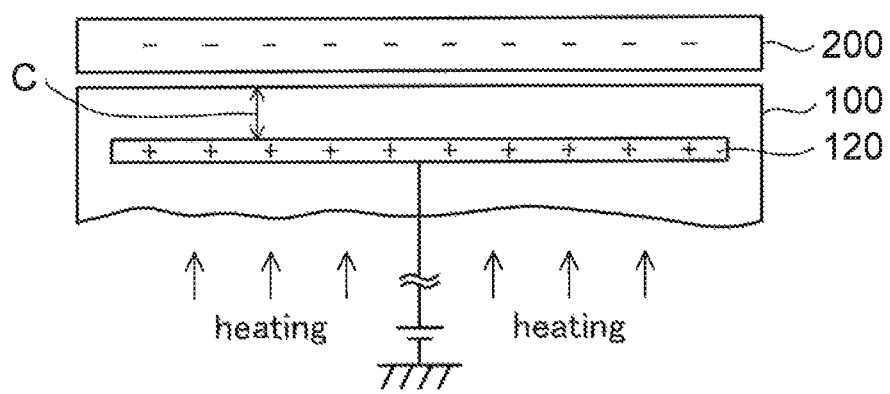
FIG. 1 is a cross-sectional view for explaining the problem of an electrostatic chuck according to a preliminary matter.

FIG. 1 partially depicts a state that a silicon wafer 200 is placed on a placing stage 100 of a high-temperature type electrostatic chuck. The silicon wafer 200 is placed on the placing stage 100 in a state that the placing stage 100 is heated to about 150° C.

An electrostatic electrode 120 is arranged inside the placing stage 100. The placing stage 100 is formed from a ceramic mainly including aluminum oxide.

Then when positive(+) voltage is applied to the electrostatic electrode 120, the electrostatic electrode 120 is electrostatically charged to positive(+) charges, and negative(−) charges are induced in the silicon wafer 200. By this matter, the silicon wafer 200 is attracted to the placing stage 100 by the coulomb force therebetween.

Assuming that the silicon wafer 200, the electrostatic electrode 120, and a ceramic portion C of the placing stage 100 arranged therebetween form a capacitor, the ceramic portion C corresponds to the dielectric layer. Electric properties, particularly the volume resistivity, of the ceramic portion C as the dielectric layer greatly influences the attraction and detachment properties of the silicon wafer 200.

In general, ceramics have such electric properties that their volume resistivity decreases as their temperature increases. In FIG. 1, when the volume resistivity of the ceramic portion C decreases by the heating, it is easy to be electrostatically charged between the silicon wafer 200 and the electrostatic electrode 120. Therefore, the silicon wafer 200 is attracted to the placing stage 100 by stronger coulomb force.

For this reason, even after the voltage applied to the electrostatic electrode 120 is turned off, it is in a state that the charges remain in the silicon wafer 200, thereby it is difficult to immediately detach the silicon wafer 200.

At this time, if lift pins forcibly detach the silicon wafer 200, the spring or the crack of the silicon wafer 200 occurs, thereby causing a conveying error easily. For this reason, every time a silicon wafer 200 is processed, it is necessary to wait a certain length of time until the attraction force becomes weak after the voltage applied to the electrostatic chuck is turned off. Thus, the throughput of the wafer processing is decreased.

An electrostatic chuck of an embodiment to be explained below can solve the above problem.

Embodiment

Figure 2:
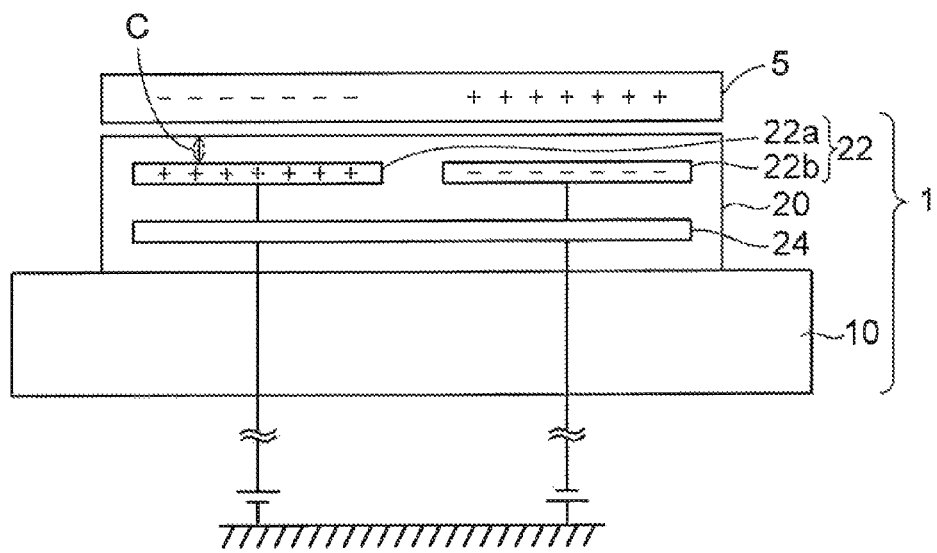
FIG. 2 is a cross-sectional view depicting an electrostatic chuck of an embodiment.
Figure 3:
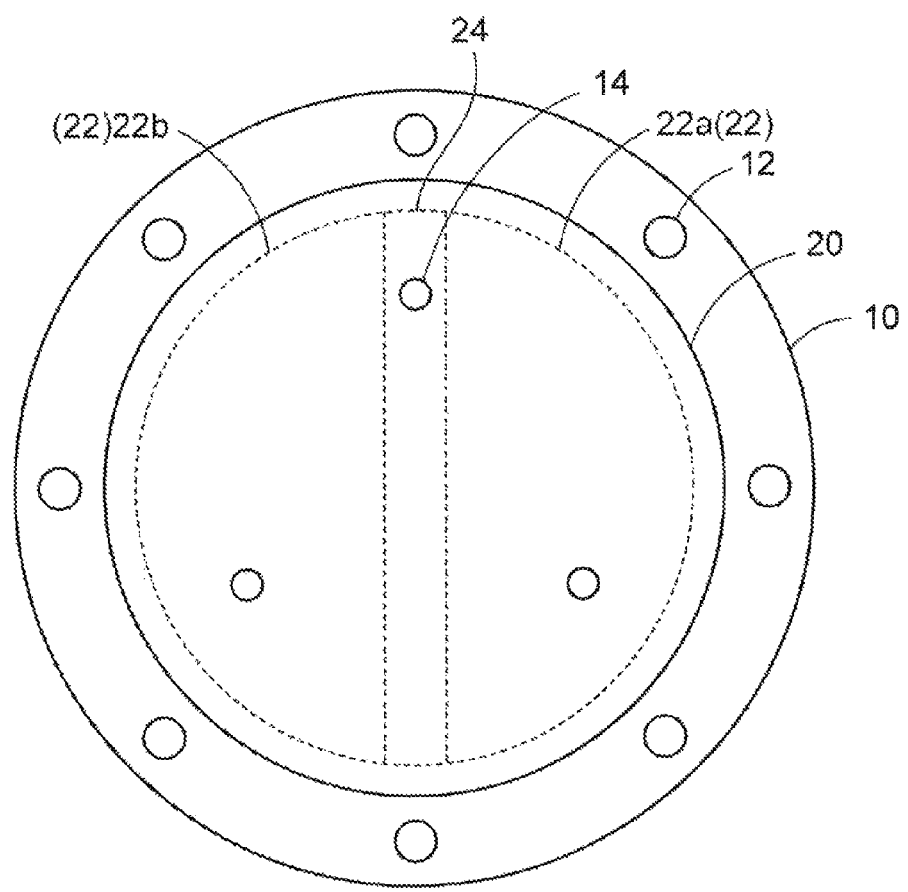
FIG. 3 is a plan view of the electrostatic chuck in FIG. 2 as seen from above.

FIGS. 2 and 3 are views depicting an electrostatic chuck of an embodiment. As depicted in FIG. 2, in an electrostatic chuck 1 of the embodiment, a placing stage 20 is arranged on an aluminum base 10. An electrostatic electrode 22 and a heater 24 are arranged inside the placing stage 20. The placing stage 20 is formed from a ceramic mainly including aluminum oxide ($Al_2O_3$).

As a method of making the placing stage 20, a metal material for the electrostatic electrode 22 and an electric heat material for the heater 24 are each sandwiched between green sheets, and the resultant laminated body is sintered. By this matter, the placing stage 20 in which the electrostatic electrode 22 and the heater 24 are built in can be obtained. Tungsten paste or the like is used as the material of each of the electrostatic electrode 22 and the heater 24.

The aluminum base 10 may be formed solely from aluminum or from an aluminum alloy. Alternatively, a metal base formed from a different metal material may be used instead of the aluminum base 10.

Then a wafer 5 is placed on the placing stage 20 as a substrate. A semiconductor wafer such as a silicon wafer is used as the wafer 5.

The aluminum base 10 and the placing stage 20 may be fixed each other by an adhesive layer (not depicted) or fixed each other by a screw clamp (not depicted).

As depicted in the plan view of FIG. 3, when seeing the electrostatic chuck 1 in FIG. 2A from the upper side, the placing stage 20 having a circular disk shape whose area is smaller than the aluminum base 10 is arranged on the aluminum base 10 having a circular disk shape, such that a peripheral part of the aluminum base 10 is exposed.

Attachment holes 12 for attaching to a chamber of a semiconductor manufacturing device are provided in the exposed peripheral part of the aluminum base 10 so as to align with an annular arrangement. Moreover, three lift-pin opening portions 14 in which lift pins for vertically moving the wafer 5 are inserted, are provided in a center part of each of the placing stage 20 and the aluminum base 10. By moving the wafer 5 by the lift pins up and down, the wafer 5 can be automatically conveyed by a conveying robot.

Also, an inert gas such as helium (He) may be supplied to the upper side of the placing stage 20 from the lift-pin opening portions 14. By flowing the inert gas between the placing stage 20 and the wafer 5, the heat of the electrostatic chuck 1 heated can be efficiently transmitted to the wafer 5. Alternatively, gas opening portions in which the inner gas is supplied may be provided specially.

In the example of FIGS. 2 and 3, the electrostatic electrode 22 built in the placing stage 20 is of a bipolar type and is divided into a first electrostatic electrode 22a and a second electrostatic electrode 22b. Alternatively, a unipolar type electrostatic electrode 22 including a single electrostatic electrode may be used.

Moreover, the heater 24 is arranged under the first electrostatic electrode 22a and the second electrostatic electrode 22b. The heater 24 may be provided as a single heater electrode, or may be divided into a plurality of heater zones and the heating of each heater zone may capable be controlled independently.

Then, as depicted in FIG. 2, in the electrostatic chuck 1 of the embodiment, the wafer 5 is placed on the placing stage 20, positive(+) voltage is applied to the first electrostatic electrode 22a, and negative(−) voltage is applied to the second electrostatic electrode 22b.

By this matter, the first electrostatic electrode 22a is electrostatically charged to positive(+) charges, and the second electrostatic electrode 22b is electrostatically charged to negative(−) charges. Following this, negative(−) charges are induced in a part of the wafer 5 corresponding to the first electrostatic electrode 22a, and positive(+) charges are induced in a part of the wafer 5 corresponding to the second electrostatic electrode 22b.

In this way, the wafer 5 is electrostatically attracted on the placing stage 20 by the coulomb force generated between the electrostatic electrode 22 and the wafer 5 through a ceramic portion C.

At this time, predetermined voltage is applied to the heater 24 and heat is generated from the placing stage 20. Thus the wafer 5 is heated and controlled at a predetermined temperature. The heating temperature of the electrostatic chuck 1 is set to a range in 100° C. to 200° C., for example, to 150° C.

As explained in the foregoing preliminary matter, in the high-temperature type electrostatic chuck manufactured from the ceramic that the volume resistivity greatly decreases by the heating, there is the problem that the wafer cannot be immediately detached even when the applied voltage is turned off.

To solve this, the inventor of the present application has found a ceramic material in which the volume resistivity of the electrostatic chuck 1 does not greatly decrease even when the electrostatic chuck 1 is heated to about 150° C., and the volume resistivity within the specification range can be obtained.

If the volume resistivity of the ceramic is within a range of 1E+16 Ωcm to 1E+17 Ωcm when the electrostatic chuck is in use, the wafer 5 can be attracted to the placing stage 20 by sufficiently strong attraction force, and also the wafer 5 can be stably detached immediately after the voltage is turned off.

Figures 4, 5:
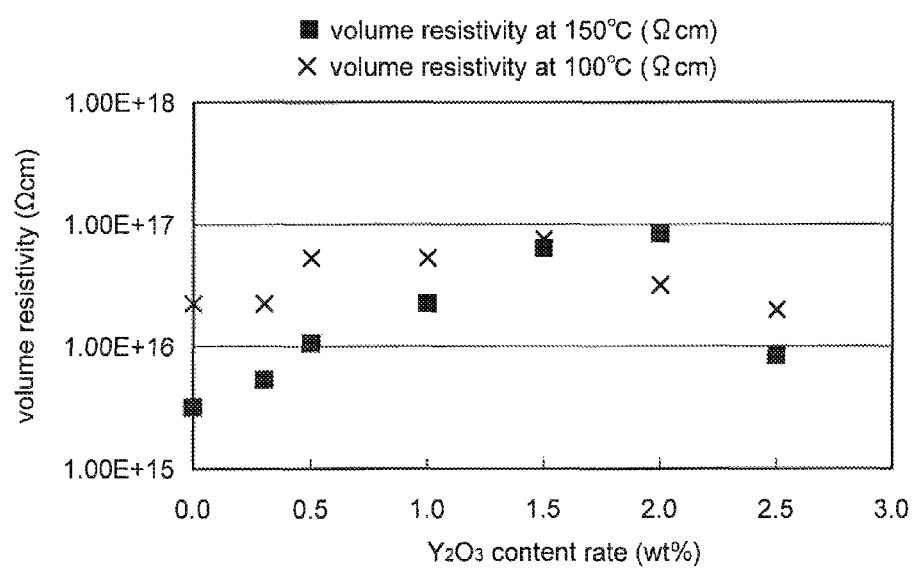
FIG. 4 is data depicting the dependency of the volume resistivity of heated ceramic in the electrostatic chuck of the embodiment, on the content rate of yttrium oxide.
FIG. 5 is a graphical representation of the data in FIG. 4.

As depicted in FIG. 4, the inventor of the present application made ceramic samples 1 to 7 each of which was a ceramic mainly including aluminum oxide. And the content rates of yttrium oxide ($Y_2O^3$) in the samples 1 to 7 were varied from 0 wt % to 2.5 wt %.

Then, the volume resistivity of the each ceramic when the samples 1 to 7 were heated to 150° C. is investigated. Also, likewise, the volume resistivity of the each ceramic when the samples 1 to 7 were heated to 100° C. is investigated.

When each of samples 1 to 7 is made, their content rates of aluminum oxide ($Al^2O_3$), silicon dioxide ($SiO_2$), magnesium oxide (MgO), and calcium oxide (CaO) were set as below.

$Al^2O_3$: 94.2 wt % to 96.1 wt %
$SiO_2$: 2.6 wt %
MgO: 1.0 wt % to 1.1 wt %
CaO: fixed at 0.2 wt %

Moreover, all the samples 1 to 7 were made such that their relative densities may be set to 95.5% or more. Note that the specification range of the volume resistivity of the ceramic that the wafer detachment does not become the problem when the ceramic is heated, is set to be 1E+16 Ωcm to 1E+17 Ωcm.

FIG. 5 is a graphical representation of data on the volume resistivity of each of the samples 1 to 7 in FIG. 4. First, the results obtained by heating the samples 1 to 7 at 150° C. will be explained. According to the results, as depicted by the samples 1, 2 in FIG. 4 and in FIG. 5, when the content rate of yttrium oxide was in a range of 0 wt % to 0.3 wt %, the volume resistivity of the ceramic was 2.89E+15 Ωcm to 5.14E+15 Ωcm.

Each of these samples had significantly lower volume resistivity than the volume resistivity in the specification range (1E+16 Ωcm to 1E+17 Ωcm) and was found to be not preferable as the ceramic material for the high-temperature type electrostatic chuck.

As in the case of the sample 3, when the content rate of yttrium oxide was further increased to 0.5 wt %, the volume resistivity of the ceramic was also increased to 1.03E+16 Ωcm. Moreover, as in the case of the sample 4, when the content rate of yttrium oxide was further increased to 1.0 wt %, the volume resistivity of the ceramic was also increased to 2.0E+16 Ωcm.

Moreover, as in the case of the sample 5, when the content rate of yttrium oxide was further increased to 1.5 wt %, the volume resistivity of the ceramic was also increased to 5.82E+16 Ωcm. Moreover, as in the case of the sample 6, when the content rate of yttrium oxide was further increased to 2.0 wt %, the volume resistivity was also increased to 8.67E+16 Ωcm.

In this way, it was found that when the content rate of yttrium oxide was in a range of 0.5 wt % to 2.0 wt %, the volume resistivity of the ceramic was 1.03E+16 Ωcm to 8.67E+16 Ωcm, and which fell within the specification range of volume resistivity.

Moreover, it was found that when the content rate of yttrium oxide was further increased to 2.5 wt %, the volume resistivity of the ceramic was 7.99E+15 Ωcm, and which departs from the specification range of volume resistivity (1E+16 Ωcm to 1E+17 Ωcm), and decreased as opposed to the previous samples.

Referring to FIG. 5, it was found that the volume resistivity of the ceramic linearly increased as the content rate of yttrium oxide increased from 0 wt % to 2.0 wt %. By changing the content rate of yttrium oxide on the basis of utilizing this characteristic, the volume resistivity of the ceramic at 150° C. can be adjusted accurately to a target value within the specification range (1E+16 Ωcm to 1E+17 Ωcm).

Meanwhile, in order to obtain the result of the volume resistivity of the ceramic at 150° C. described above, the relative density of the ceramic of each of the samples 1 to 7 is desirably set to 95.5% or more.

In this way, in the case of heating at 150° C., the volume resistivity of the ceramic within the specification range can be obtained by setting the content rate of yttrium oxide within the range of 0.5 wt % to 2.0 wt %. By making the above-mentioned placing stage 20 from a ceramic under this condition, it is possible to obtain the high-temperature type electrostatic chuck in which the wafer can be stably detached therefrom immediately after the voltage is turned off.

Next, the results obtained by heating the samples 1 to 7 at 100° C. will be explained. According to the results, when the content rate of yttrium oxide was in a range of 0 wt % to 2.5 wt %, the volume resistivity of the ceramic was 2.32E+16 Ωcm to 6.17E+16 Ωcm. That is, all the samples 1 to 7 fell within the specification range of the volume resistivity (1E+16 Ωcm to 1E+17 Ωcm) under the condition in which the ceramic was heated at 100° C.

Under the condition in which the ceramic was heated at 100° C., the characteristic in which the volume resistivity of the ceramic to the content rate of yttrium oxide linearly increases cannot be obtained. When the content rate of yttrium oxide was 2.5 wt %, the volume resistivity had a minimum value of 2.32E+16 Ωcm, and when the content rate of yttrium oxide was 1.5 wt %, the volume resistivity had a maximum value of 6.17E+16 Ωcm.

Meanwhile, though no data is presented, in the case that the ceramic is heated at about 200° C., the volume resistivity of the ceramic decreases than the case that the ceramic is heated at 150° C. In FIG. 5, when the content rate of yttrium oxide is in a range of 1.0 wt % to 2.0 wt %, even though the volume resistivity decreases than the data at 150° C., the volume resistivity still falls within the specification range (1E+16 Ωcm to 1E+17 Ωcm), therefore it can be used also in the case of being heated at about 200° C.

Accordingly, in the case that the electrostatic chuck is heated at about 150° C. to 200° C., the content rate of yttrium oxide is preferably set within a range of 1.0 wt % to 2.0 wt %.

As described above, by setting the content rate of yttrium oxide within a range of 0.5 wt % to 2.0 wt %, the wafer can be easily detached even when the electrostatic chuck is heated at the temperature of 100° C. to 200° C.

Figure 6:
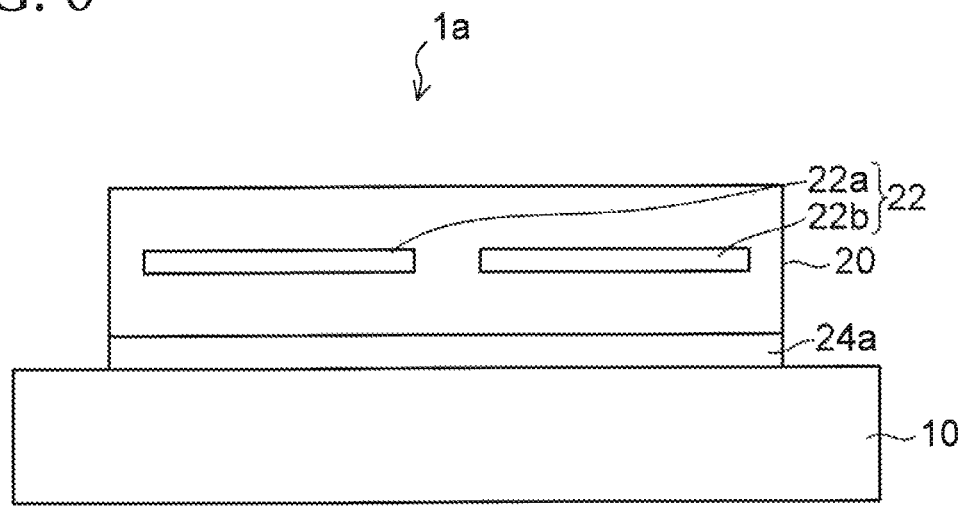
FIG. 6 is a cross-sectional view depicting an electrostatic chuck of a first modification of the embodiment.

FIG. 6 depicts an electrostatic chuck 1a of a first modification of the embodiment. Like the electrostatic chuck 1a of the first modification in FIG. 6, a heater 24a may be arranged between the aluminum base 10 and the placing stage 20.

Figure 7:
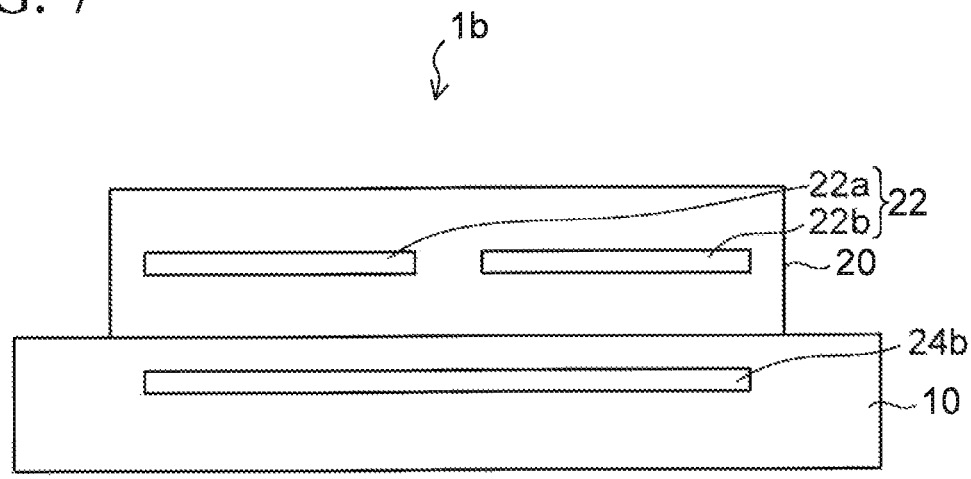
FIG. 7 is a cross-sectional view depicting an electrostatic chuck of a second modification of the embodiment.

Alternatively, like an electrostatic chuck 1b of a second modification in FIG. 7, a heater 24b can be built in the aluminum base 10 as well. Furthermore, though not depicted, an external heater may be attached to the lower side of the aluminum base of the electrostatic chuck.

Moreover, the electrostatic chuck may include no heater, and instead, a heater member formed of a lamp heater or the like may be provided to a stage in the chamber of the semiconductor manufacturing device, and the electrostatic chuck may be attached on the heater member.

Figure 8:
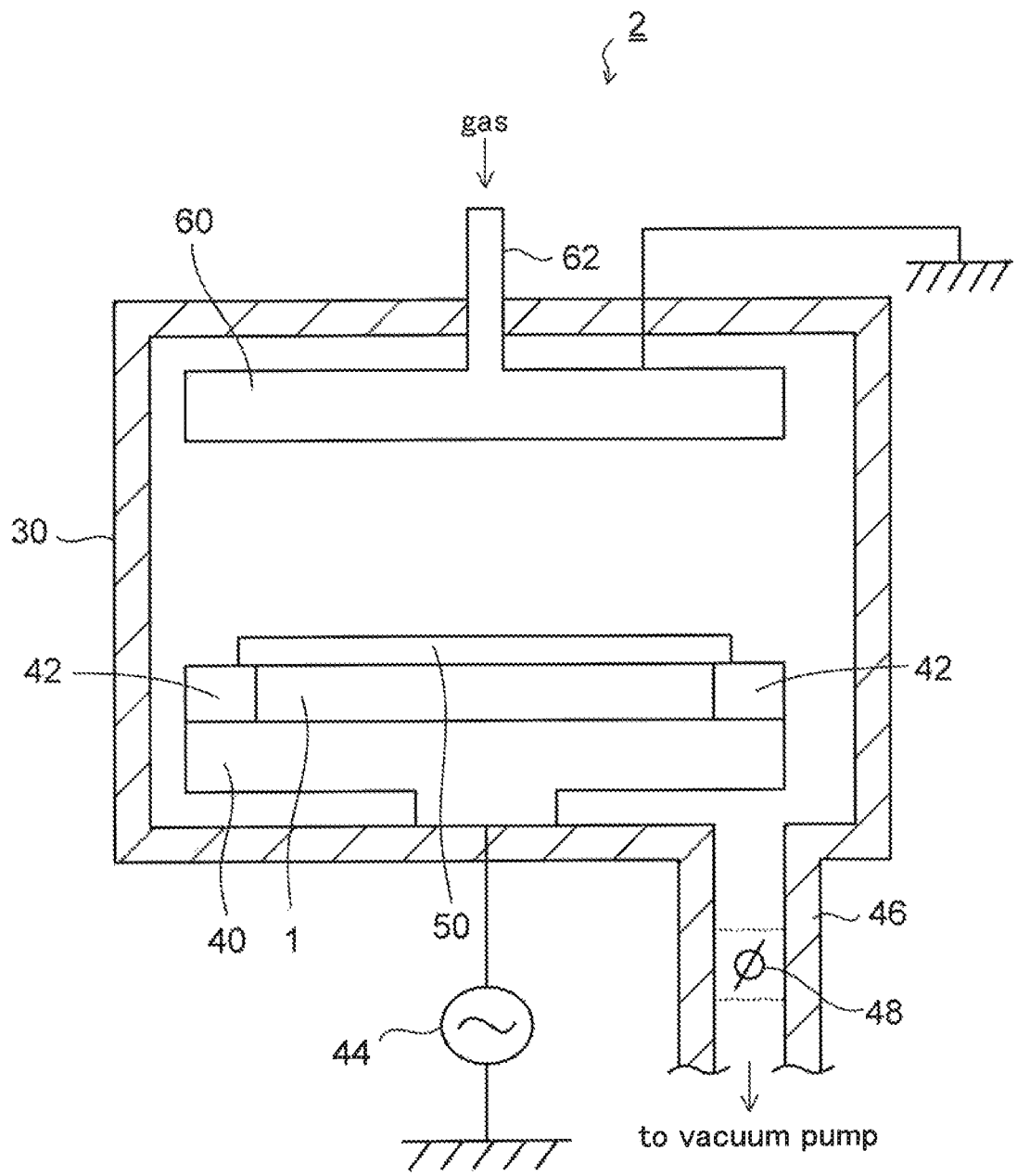
FIG. 8 is a cross-sectional view depicting a dry etching device including the electrostatic chuck of the embodiment.

Next, an example in which the electrostatic chuck 1 of this embodiment is applied to a dry etching device will be explained. FIG. 8 is a cross-sectional view depicting a drying etching device of the embodiment. As depicted in FIG. 8, a parallel plate type RIE device is exemplarily depicted as a dry etching device 2.

The dry etching device 2 includes a chamber 30, and a lower electrode 40 is arranged in a lower side of the chamber 30. The electrostatic chuck 1 of the embodiment explained above is attached to the front side of the lower electrode 40, and a semiconductor wafer 50 is placed on the electrostatic chuck 1. A quartz ring 42 for protection is arranged at the periphery of the electrostatic chuck 1.

A high-frequency power supply 44 for applying RF power is connected to the lower electrode 40 and the electrostatic chuck 1. An RF matcher (not depicted) for matching of the output of the RF power is connected to the high-frequency power supply 44.

An upper electrode 60 which serves as the opposite electrode of the lower electrode 40 is arranged in an upper side of the chamber 30, and the upper electrode 60 is grounded. A gas inlet pipe 62 is joined to the upper electrode 60, and a predetermined etching gas is introduced into the chamber 30.

An outlet pipe 46 is connected to a lower part of the chamber 30, and a vacuum pump is attached to the distal end of the outlet pipe 46. By this matter, the reaction products or the like which are generated by the etching can be exhausted through the outlet pipe 46 to an exhaust-gas treatment equipment on the outside. An automatic pressure control valve 48 (APC valve) is provided in the outlet pipe 46 near the chamber 30, and the opening degree of the APC valve 48 is automatically adjusted such that the inside of the chamber 30 is made to a set pressure.

In the dry etching device 2 of this embodiment, the electrostatic chuck 1 is heated to about 150° C. by the heater 24

(FIG. 2), and the semiconductor wafer 50 is conveyed and placed onto the electrostatic chuck 1.

Then, voltages of ±3000 V are applied at the maximum to the first and second electrostatic electrodes 22a, 22b (FIG. 2) of the electrostatic chuck 1 to attract the semiconductor wafer 50 to the electrostatic chuck 1. By the matter, it is in a state that the semiconductor wafer 50 is heated at a temperature of 150° C.

Thereafter, a halogen gas such as a chlorine-based gas or a fluorine-based gas is introduced into the chamber 30 through the gas inlet pipe 62, and the inside of the chamber 30 is set to a predetermined pressure by the function of the APC valve 48. Then, the RF power is applied to the lower electrode 40 and the electrostatic chuck 1 from the high-frequency power supply 44, so that plasma is generated in the chamber 30.

By applying the RF power to the electrostatic chuck 1, negative self-bias is formed in the electrostatic chuck 1 side, in the result, positive ions in the plasma are accelerated toward the electrostatic chuck 1. Based on this, an etching target layer formed on the semiconductor wafer 50 is anisotropically etched in a high-temperature atmosphere at 150° C. or more, and is patterned.

A copper (Cu) layer or the like is available as the etching target layer in which the high-temperature etching is applied. Since the volatility of copper chloride is low, it easily volatilizes by heating to the high temperature. In this way, the etching can be done easily.

As mentioned above, even when the electrostatic chuck 1 of this embodiment is heated to about 150° C., the volume resistivity of the ceramic portion C (FIG. 2) does not greatly decrease but volume resistivity in the specification range can be obtained.

For this reason, immediately after the etching is finished and the voltage applied to the electrostatic chuck 1 is turned off, by raising the lift pins (not depicted), the semiconductor wafer 50 can be stably detached from the electrostatic chuck 1. In this embodiment, after the voltage applied to the electrostatic chuck 1 is turned off, it is not necessary to wait a certain length of time until the attraction force of the semiconductor wafer 50 becomes weak. Accordingly, the throughput of the wafer processing can be improved.

Moreover, the conveying error due to the spring or the crack of the semiconductor wafer 50 is hard to occur as well. Therefore, the manufacturing yield of semiconductor devices can be improved.

In FIG. 8, the electrostatic chuck 1 of this embodiment is applied to the dry etching device. However, the electrostatic chuck 1 may be applied to various types of semiconductor manufacturing devices used for semiconductor wafer processing such as plasma CVD devices and sputtering devices.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electrostatic chuck, comprising:
    a placing stage formed from a ceramic including aluminum oxide and yttrium oxide; and
    an electrostatic electrode arranged in the placing stage, wherein a content rate of the aluminum oxide is 94.2 wt % to 96.1 wt %, and a content rate of the yttrium oxide is 0.5 wt % to 2.0 wt %.

2. The electrostatic chuck according to claim 1, wherein the content rate of the yttrium oxide is 1.0 wt % to 2.0 wt %.

3. The electrostatic chuck according to claim 1, wherein the electrostatic chuck is used while being heated at a temperature of 100° C. to 200° C.

4. The electrostatic chuck according to claim 1, wherein the ceramic includes silicon dioxide, magnesium oxide, and calcium oxide.

5. The electrostatic chuck according to claim 4, wherein
    a content rate of the silicon dioxide is 2.6 wt %,
    a content rate of the magnesium oxide is 1.0 wt % to 1.1 wt %, and
    a content rate of the calcium oxide is 0.2 wt %.

6. The electrostatic chuck according to claim 1, wherein a relative density of the ceramic is 95.5% or more.

7. The electrostatic chuck according to claim 3, wherein the electrostatic chuck includes a heater.

8. The electrostatic chuck according to claim 3, wherein
    in a case that the electrostatic chuck is heated at 150° C., volume resistivity of the ceramic increases linearly as the content rate of the yttrium oxide increases, and
    the volume resistivity of the ceramic is adjusted by the content rate of the yttrium oxide.

9. A semiconductor manufacturing device, comprising:
    a chamber; and
    an electrostatic chuck attached to the chamber,
    wherein the electrostatic chuck includes
        a placing stage formed from a ceramic including aluminum oxide and yttrium oxide, and
        an electrostatic electrode arranged in the placing stage, and
    a content rate of the aluminum oxide is 94.2 wt % to 96.1 wt %, and a content rate of the yttrium oxide is 0.5 wt % to 2.0 wt %.

* * * * *